United States Patent
Noguchi et al.

(10) Patent No.: US 11,523,518 B2
(45) Date of Patent: Dec. 6, 2022

(54) METHOD OF MAKING FLEXIBLE PRINTED CIRCUIT BOARD AND FLEXIBLE PRINTED CIRCUIT BOARD

(71) Applicant: SUMITOMO ELECTRIC PRINTED CIRCUITS, INC., Shiga (JP)

(72) Inventors: Kou Noguchi, Shiga (JP); Hiroshi Ueda, Shiga (JP)

(73) Assignee: SUMITOMO ELECTRIC PRINTED CIRCUITS, INC., Shiga (JP)

(*) Notice: Subject to any disclaimer, the term of this patent is extended or adjusted under 35 U.S.C. 154(b) by 93 days.

(21) Appl. No.: 16/766,884

(22) PCT Filed: Nov. 23, 2018

(86) PCT No.: PCT/JP2018/043301
§ 371 (c)(1),
(2) Date: May 26, 2020

(87) PCT Pub. No.: WO2019/107289
PCT Pub. Date: Jun. 6, 2019

(65) Prior Publication Data
US 2021/0022254 A1 Jan. 21, 2021

(30) Foreign Application Priority Data
Nov. 28, 2017 (JP) .............................. JP2017-228276

(51) Int. Cl.
*H05K 1/00* (2006.01)
*H05K 1/02* (2006.01)
(Continued)

(52) U.S. Cl.
CPC ............. *H05K 3/281* (2013.01); *H05K 3/386* (2013.01); *H05K 3/425* (2013.01); *H05K 2203/06* (2013.01)

(58) Field of Classification Search
CPC .. H05K 1/00; H05K 1/02; H05K 1/03; H05K 1/09; H05K 1/14; H05K 1/16; H05K 1/18;
(Continued)

(56) References Cited

U.S. PATENT DOCUMENTS 6,353,080 B1 * 3/2002 Gan ...................... C08G 59/182
523/435
6,889,433 B1 * 5/2005 Enomoto ............. H05K 3/4069
29/846
(Continued)

FOREIGN PATENT DOCUMENTS

| CN | 106664800 | 5/2017 |
|---|---|---|
| JP | 2006-261383 | 9/2006 |

(Continued)

*Primary Examiner* — Xiaoliang Chen
(74) *Attorney, Agent, or Firm* — IPUSA, PLLC

(57) ABSTRACT

According to an aspect of the present disclosures, a method of making a flexible printed circuit board, which includes a base film having an insulating property, a conductive pattern disposed on either one or both surfaces of the base film, and a cover layer covering a conductive-pattern side of a laminated structure inclusive of the base film and the conductive pattern, includes a superimposing step of superimposing a cover film on the conductive-pattern side of the laminated structure, the cover film having a first resin layer and a second resin layer that is laminated to an inner side of the first resin layer and that softens at a lower temperature than does the first resin layer, and a pressure bonding step of vacuum bagging the laminated structure and the cover film at a temperature higher than a softening temperature of the second resin layer.

8 Claims, 2 Drawing Sheets

(51) Int. Cl.
*H05K 1/03* (2006.01)
*H05K 1/09* (2006.01)
*H05K 1/14* (2006.01)
*H05K 1/16* (2006.01)
*H05K 1/18* (2006.01)
*H05K 3/00* (2006.01)
*H05K 3/10* (2006.01)
*H05K 3/36* (2006.01)
*H05K 3/38* (2006.01)
*H05K 3/40* (2006.01)
*H05K 3/46* (2006.01)
*G02B 6/12* (2006.01)
*G02B 6/13* (2006.01)
*G02B 6/36* (2006.01)
*H05K 3/28* (2006.01)
*H05K 3/42* (2006.01)

(58) Field of Classification Search
CPC .. H05K 3/00; H05K 3/10; H05K 3/36; H05K 3/38; H05K 3/40; H05K 3/46; H05K 3/281; H05K 3/386; H05K 3/425; G02B 6/12; G02B 6/13; G02B 6/36
USPC .......... 174/254, 252, 255, 258, 264; 29/825, 29/846, 852, 605
See application file for complete search history.

(56) References Cited

U.S. PATENT DOCUMENTS

| | | | | |
|---|---|---|---|---|
| 6,930,258 B1* | 8/2005 | Kawasaki | H05K 1/113 | 361/795 |
| 10,321,578 B2* | 6/2019 | Takano | H05K 3/101 | |
| 2003/0089519 A1* | 5/2003 | Okada | H05K 1/09 | 174/254 |
| 2004/0212030 A1* | 10/2004 | Asai | H05K 1/0274 | 257/432 |
| 2005/0073044 A1* | 4/2005 | Tomabechi | H05K 1/0204 | 257/E23.101 |
| 2006/0012967 A1* | 1/2006 | Asai | H05K 1/0274 | 361/764 |
| 2006/0065534 A1* | 3/2006 | Nakai | C25D 5/02 | 204/225 |
| 2006/0163740 A1* | 7/2006 | Ohno | H01L 23/49816 | 174/257 |
| 2006/0194063 A1* | 8/2006 | Murai | C08G 59/1405 | 528/421 |
| 2007/0090299 A1* | 4/2007 | Kozakai | C09J 7/38 | 250/370.11 |
| 2007/0297729 A1* | 12/2007 | Kodama | H05K 1/0274 | 385/94 |
| 2008/0090075 A1* | 4/2008 | Kondo | B32B 7/12 | 524/100 |
| 2008/0170819 A1* | 7/2008 | Kodama | H01L 27/14627 | 385/14 |
| 2008/0236876 A1* | 10/2008 | Kodama | G02B 6/43 | 174/260 |
| 2008/0241452 A1* | 10/2008 | Kondo | H05K 3/386 | 524/133 |
| 2008/0247703 A1* | 10/2008 | Kodama | G02B 6/4214 | 385/14 |
| 2008/0247704 A1* | 10/2008 | Kodama | H05K 1/0274 | 385/14 |
| 2008/0254300 A1* | 10/2008 | Arai | B32B 27/38 | 428/422.8 |
| 2008/0317402 A1* | 12/2008 | Kodama | G02B 6/43 | 385/14 |
| 2009/0151990 A1 | 6/2009 | Nishino et al. | | |
| 2010/0065317 A1* | 3/2010 | Okada | C08J 5/24 | 156/182 |
| 2010/0181285 A1* | 7/2010 | Tanaka | H05K 1/162 | 216/17 |
| 2011/0005811 A1* | 1/2011 | Yamato | H05K 3/4635 | 29/830 |
| 2011/0007478 A1* | 1/2011 | Takahashi | H01L 23/3121 | 361/721 |
| 2011/0147053 A1* | 6/2011 | Kawaguchi | H05K 1/0218 | 174/250 |
| 2011/0247865 A1* | 10/2011 | Tsurumi | H05K 3/4661 | 174/255 |
| 2013/0199830 A1* | 8/2013 | Morita | C08G 59/22 | 522/170 |
| 2013/0237639 A1* | 9/2013 | Ogura | C08G 59/621 | 523/400 |
| 2013/0260207 A1* | 10/2013 | Uemura | H01M 50/409 | 521/134 |
| 2014/0268780 A1* | 9/2014 | Wang | F21V 19/003 | 362/249.06 |
| 2016/0107376 A1* | 4/2016 | Nakajima | H05K 1/0353 | 428/447 |
| 2016/0163451 A1* | 6/2016 | Wang | H01F 27/2804 | 336/200 |
| 2016/0340555 A1* | 11/2016 | Ueki | C09D 167/00 | |
| 2017/0135206 A1 | 5/2017 | Ueda et al. | | |
| 2018/0111293 A1* | 4/2018 | Konagawa | B32B 27/28 | |
| 2018/0186935 A1* | 7/2018 | Komatsu | B32B 27/06 | |
| 2018/0215971 A1* | 8/2018 | Chen | C09J 11/06 | |
| 2018/0220530 A1* | 8/2018 | Chen | C08L 71/126 | |
| 2018/0339493 A1* | 11/2018 | Chen | B32B 15/14 | |
| 2018/0339497 A1* | 11/2018 | Makino | B32B 27/32 | |
| 2019/0002689 A1* | 1/2019 | Chen | C08J 5/24 | |
| 2019/0214321 A1* | 7/2019 | Ito | H05K 1/0306 | |
| 2019/0288092 A1* | 9/2019 | Katayama | H01L 27/1248 | |
| 2019/0320527 A1* | 10/2019 | Masaki | H05K 3/4635 | |
| 2020/0150725 A1* | 5/2020 | Saitoh | H01L 51/0097 | |

FOREIGN PATENT DOCUMENTS

| | | |
|---|---|---|
| JP | 2011-105811 | 6/2011 |
| JP | 2012-089700 | 5/2012 |
| WO | 2017/047498 | 3/2017 |

* cited by examiner

US 11,523,518 B2

METHOD OF MAKING FLEXIBLE PRINTED CIRCUIT BOARD AND FLEXIBLE PRINTED CIRCUIT BOARD

TECHNICAL FIELD

The disclosures herein relate to a method of making a flexible printed circuit board and a flexible printed circuit board. The present application claims priority to Japanese patent application No. 2017-228276 filed on Nov. 28, 2017, and the entire contents of the Japanese patent application are hereby incorporated by reference.

BACKGROUND ART

In recent years, to keep up with reduction in the size and weight of electronic devices, electronic components such as planar coils constituting electronic devices have been mounted on flexible printed circuit boards and reduced in size (see, for example, Japanese Patent Application Laid-Open No. 2012-89700).

A planar coil described in the above-noted publication is made by forming a primary copper plating layer on a substrate, removing the substrate, and forming a secondary copper plating layer on the same surface of the primary copper plating layer that has been in contact with the substrate. As a result, the planar coil has an increased aspect ratio compared to a planar coil comprised only of a primary copper plating layer formed on a substrate, and can thus be reduced in size to a certain extent.

RELATED-ART DOCUMENTS

Patent Document

Patent Document 1: Japanese Patent Application Publication No. 2012-89700

SUMMARY OF THE INVENTION

According to an aspect of the present disclosures, a method of making a flexible printed circuit board, which includes a base film having an insulating property, a conductive pattern disposed on either one or both surfaces of the base film, and a cover layer covering a conductive-pattern side of a laminated structure inclusive of the base film and the conductive pattern, includes a superimposing step of superimposing a cover film on the conductive-pattern side of the laminated structure, the cover film having a first resin layer and a second resin layer that is laminated to an inner side of the first resin layer and that softens at a lower temperature than does the first resin layer, and a pressure bonding step of vacuum bagging the laminated structure and the cover film at a temperature higher than a softening temperature of the second resin layer.

According to another aspect of the present disclosures, a flexible printed circuit board which includes a base film having an insulating property, a conductive pattern disposed on either one or both surfaces of the base film, and a cover layer covering a conductive-pattern side of a laminated structure inclusive of the base film and the conductive pattern is such that the cover layer includes a first resin layer covering the laminated structure, and a second resin layer laminated to an inner side of the first resin layer and injected onto the conductive-pattern side of the laminated structure, wherein the main polymer of the first resin layer is a polyimide, and the main polymer of the second resin layer is an epoxy resin.

MODE FOR CARRYING OUT THE INVENTION

Figure 1:
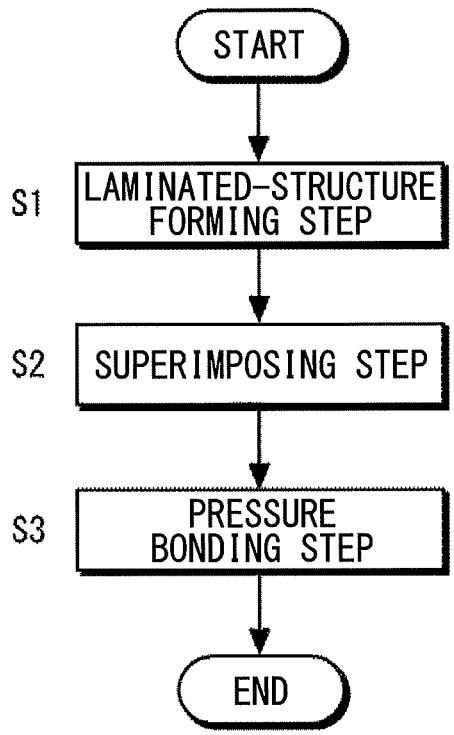
FIG. 1 is a flowchart illustrating a method of making a flexible printed circuit board according to an embodiment of the present disclosures.

Problem to be Solved by the Present Disclosures

The planar coil described in the previously-noted publication is covered with an inner resin coating layer, and a resin overcoating layer and an outer insulating layer are laminated in this order on the inner resin coating layer, thereby to produce a flexible printed circuit board.

Electronic components mounted on the conventional flexible printed circuit board as described above are reduced in size. However, what is required is the reduction in the size of an entire flexible printed circuit board. In this regard, there is room for improvement in the thickness of a cover layer covering the electronic components on the conventional flexible printed circuit board.

The present disclosures are made in light of the circumstances described above, and is directed to providing a method of making a flexible printed circuit board and a flexible printed circuit board that allows the thickness of a cover layer covering an electronic component to be decreased.

Advantage of the Present Disclosures

A flexible printed circuit board made by a method of making a flexible printed circuit board according to the present disclosures and a flexible printed circuit board according to the present disclosures allow the thickness of a cover layer covering an electronic component to be decreased, which allows reduction in the size of an entire flexible printed circuit board.

Description of Embodiments of the Present Disclosures

According to an aspect of the present disclosures, a method of making a flexible printed circuit board, which includes a base film having an insulating property, a conductive pattern disposed on either one or both surfaces of the base film, and a cover layer covering a conductive-pattern side of a laminated structure inclusive of the base film and the conductive pattern, includes a superimposing step of superimposing a cover film on the conductive-pattern side of the laminated structure, the cover film having a first resin layer and a second resin layer that is laminated to an inner side of the first resin layer and that softens at a lower temperature than does the first resin layer, and a pressure bonding step of vacuum bagging the laminated structure and the cover film at a temperature higher than a softening temperature of the second resin layer.

The method of making a flexible printed circuit board uses a two-layer cover film that has a first resin layer and a second resin layer that is laminated to an inner side of the first resin layer. In the method of making a flexible printed circuit board, the cover film is vacuum bagged in the pressure bonding step at a temperature higher than the softening temperature of the second resin layer wherein the softening temperature of the second resin layer is lower than that of the first resin layer. As a result, the second resin layer is selectively softened to cover the conductive pattern laminated to the base film. The first resin layer laminated to the outer side of the second resin layer seals the second resin layer, which provides a cover layer. Use of the method of making a flexible printed circuit board ensures that the conductive pattern is more reliably coated even when the thickness of the cover layer is reduced, compared with the case in which the first resin layer and the second resin layer are separately laminated. This serves to reduce the size of an entire flexible printed circuit board.

The main polymer of the first resin layer may be a polyimide, and the main polymer of the second resin layer may be an epoxy resin. Use of an epoxy resin as the main polymer of the second resin layer allows the conductive pattern to be reliably coated with the second resin layer due to its fluidity obtained at the time of softening. Further, use of a polyimide as the main polymer of the first resin layer allows the second resin layer to be selectively softened, so that the second resin layer can be securely sealed with the first resin layer.

The average circuit pitch of the conductive pattern may be greater than or equal to 5 µm and less than or equal to 20 µm. Setting the average circuit pitch of a conductive pattern within the range described above allows the density of the conductive pattern to be increased, thereby providing a reliable coating with the second resin layer while maintaining the high density of mounted electronic components.

The conductive pattern may form a planar coil element. The planar coil element is designed to have a relatively thick conductive pattern, so that decreasing the thickness of the cover layer covering the planar coil greatly contributes to reducing the size of an entire flexible printed circuit board.

According to another aspect of the present disclosures, a flexible printed circuit board which includes a base film having an insulating property, a conductive pattern disposed on either one or both surfaces of the base film, and a cover layer covering a conductive-pattern side of a laminated structure inclusive of the base film and the conductive pattern is such that the cover layer includes a first resin layer covering the laminated structure, and a second resin layer laminated to an inner side of the first resin layer and injected onto the conductive-pattern side of the laminated structure, wherein the main polymer of the first resin layer is a polyimide, and the main polymer of the second resin layer is an epoxy resin.

Such a flexible printed circuit board uses an epoxy resin as the main polymer of the second resin layer so as to allow the conductive pattern to be reliably coated with the second resin layer due to its fluidity obtained at the time of softening. Further, the flexible printed circuit board uses a polyimide as the main polymer of the first resin layer so as to allow the second resin layer to be selectively softened, which results in the second resin layer being securely sealed with the first resin layer. As a result, the flexible printed circuit board allows the conductive pattern to be more reliably coated even when the thickness of the cover layer is reduced, which serves to reduce the size of an entire flexible printed circuit board.

Details of Embodiments of the Present Disclosures

In the following, embodiments of a method of making a flexible printed circuit board and a flexible printed circuit board according to the present disclosures will be described with reference to the drawings.

The method of making a flexible printed circuit board includes, as illustrated in FIG. 1, a laminated-structure forming step S1 of laminating a conductive pattern to a base film, a superimposing step S2 of superimposing a cover film on a conductive pattern side of the laminated structure, and a pressure bonding step S3 of vacuum bagging the laminated structure and the cover film.

[Flexible Printed Circuit Board]

In the following, a flexible printed circuit board made by a method of making a flexible printed circuit board will be described. The flexible printed circuit board illustrated in FIG. 3 includes a base film 1 having an insulating property, conductive patterns 2 laminated to both surfaces of the base film 1, and cover layers 4 covering the conductive patterns 2 of the laminated structure 3 including the base film and the conductive patterns 2. The conductive patterns 2 laminated to both surfaces of the base film 1 are connected to each other through a through-hole 5.

<Base Film>

The base film 1 has an insulating property, and is flexible. Examples of the main component of the base film 1 include synthetic resins such as a polyimide, polyethylene terephthalate, a fluorine resin, and a liquid crystal polymer. Among these, polyimide is preferable due to its excellent insulating property, flexibility, and heat resistance. The term "main component" refers to a component accounting for the highest content, and may refer to a component with a content of 50 wt % or more, for example.

The lower limit of the average thickness of the base film 1 is preferably 5 µm, more preferably 10 µm, and still more preferably 15 µm. The upper limit of the average thickness of the base film 1 is preferably 150 µm, more preferably 100 µm, and still more preferably 50 µm. Use of the average thickness of the base film 1 that is less than the lower limit may create a risk that the insulating property and mechanical strength are insufficient. Conversely, use of the average thickness of the base film 1 that exceeds the upper limit may create a risk of disregarding the demand for reduction in the size of a flexible printed circuit board. The term "average thickness" refers to the distance between an average line of the front surface boundary and an average line of the back surface boundary at a cross-section of the object taken along the thickness direction thereof within the range in which measurements are made. The term "average line" refers to an imaginary line which is drawn along the boundary such that the total area of peaks formed between the boundary and the imaginary line (i.e., the total area above the imaginary line) and the total area of troughs (i.e., the total area below the imaginary line) are equal to each other.

<Conductive Pattern>

Figure 2:
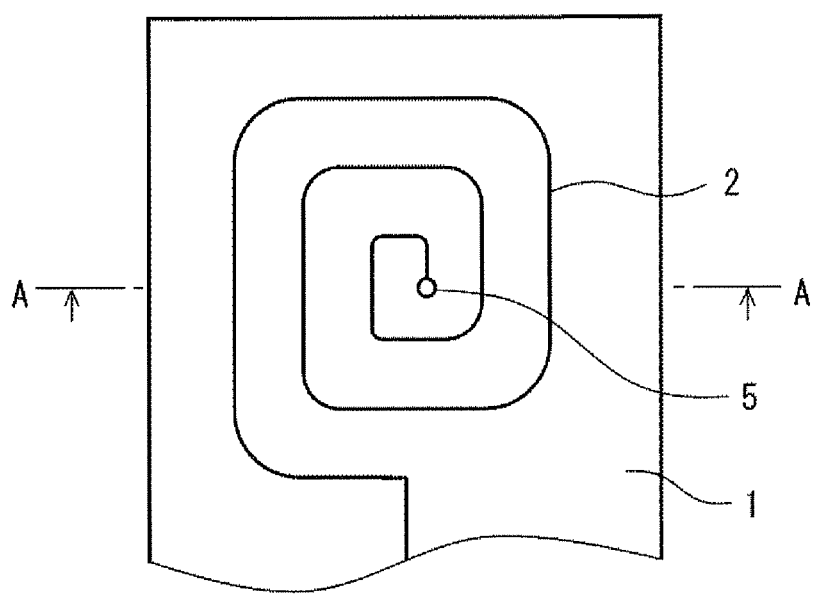
FIG. 2 is a schematic plan view illustrating a flexible printed circuit board made by the method of making a printed circuit board illustrated in FIG. 1.

The conductive patterns 2 constitute structures such as electronic components, electrical interconnect structures, the ground, shields, and the like. In the flexible printed circuit board of FIG. 2, the conductive patterns 2 form planar coil elements. The design of a planar coil element uses a relatively thick conductive pattern 2, so that decreasing the thickness of the cover layers 4 covering the planar coils greatly contributes to reducing the size of an entire flexible printed circuit board.

The conductive pattern 2 is not limited to a particular material as long as the material has electrical conductivity. Examples include metals such as copper, aluminum, and nickel. In general, copper is used due to its relatively low price and high conductivity. The conductive patterns 2 may also be plated on the surface thereof.

The lower limit of the average thickness of the conductive pattern 2 is preferably 5 µm, more preferably 10 µm, and still more preferably 20 µm. The upper limit of the average thickness of the conductive pattern 2 is preferably 80 µm and more preferably 60 µm. Use of the average thickness of the conductive pattern 2 that is less than the lower limit may create a risk that the conductivity of the conductive pattern 2 is insufficient. Conversely, use of the average thickness of the conductive pattern 2 that exceeds the upper limit results in the flexible printed circuit board being needlessly thick, which may create a risk of disregarding the demand for reduction in the thickness of a flexible printed circuit board.

The average width of the conductive patterns 2 is determined as appropriate according to the structure of an electronic component, an electrical interconnect structure, the ground, shields, and the like. The lower limit of the average width of the conductive patterns 2 is preferably 2 µm and more preferably 5 µm. Further, the upper limit of the average width of the conductive patterns 2 is preferably 15 µm and more preferably 10 µm. Use of the average width of the conductive patterns 2 that is less than the lower limit may create a risk that the conductivity of the conductive patterns 2 is insufficient. Use of the average width of the conductive patterns 2 that exceeds the upper limit causes the density of the conductive patterns to be decreased, which may create a risk that the high-density mounting of electronic components or the like becomes difficult.

The lower limit of the average circuit pitch of the conductive patterns 2 is preferably 5 µm and more preferably 7 µm. The upper limit of the average circuit pitch of the conductive patterns 2 is preferably 20 µm, more preferably 15 µm, and still more preferably 10 µm. Use of the average circuit pitch of the conductive patterns 2 that is less than the lower limit may create a risk that the conductive patterns 2 cannot be easily covered with a second resin layer 7 of the cover layers 4, which will be described later. Use of the average circuit pitch of the conductive patterns 2 that exceeds the upper limit causes the density of the conductive patterns to be decreased, which may create a risk that the high-density mounting of electronic components or the like becomes difficult. The term "the average circuit pitch of a conductive pattern" refers to the distance between the centers of conductive pattern lines next to each other when straight conductive pattern lines are arranged at the highest density.

The lower limit of the aspect ratio of the conductive patterns 2 (i.e., the ratio of the average thickness to the average width of the conductive patterns 2) is preferably 1.5 and more preferably 2. The upper limit of the aspect ratio of the conductive patterns 2 is preferably 5 and more preferably 4. Use of the average aspect ratio of the conductive patterns 2 that is less than the lower limit makes it necessary for the average width to be increased in order to reduce the resistance of the conductive patterns 2, which may create a risk that the high-density mounting of electronic components or the like becomes difficult. Conversely, use of the average aspect ratio of the conductive patterns 2 that exceeds the upper limit may create a risk that the conductive patterns 2 cannot be easily covered with the second resin layer 7 of the cover layers 4.

<Through-Hole>

The through-hole 5 provides conduction between the conductive patterns 2 laminated to the respective surfaces of the base film 1. Specifically, the through-hole 5 passes through the base film 1 and the conductive patterns 2 laminated to the respective surfaces of the base film 1 to provide electrical connection between the conductive patterns 2 laminated to the respective surfaces. A penetrating hole 5a may be formed in the laminated structure 3 made by laminating the base film 1 and the conductive patterns 2, and plating 5b or the like may be applied to the penetrating hole 5a, so that the through-hole is formed. The above-described plating 5b is not limited to a particular plating, and may be either electroplating or electroless plating. Nonetheless, electroplating is more preferred. Examples of the above-described plating types include copper plating, gold plating, nickel plating, plating of an alloy thereof, and the like. In particular, copper plating or copper alloy plating is preferable from the viewpoint of satisfactory electrical conductivity and cost reduction. Further, the through-hole 5 may alternately be formed by injecting a silver paste, a copper paste, or the like into the penetrating hole 5a and then causing the paste to be hardened by heat.

The average diameter of the through-hole 5 is selected as appropriate in consideration of workability, conductivity, and the like, and may be greater than or equal to 20 µm and less than or equal to 2000 Provision of the through-hole 5 in the flexible printed circuit board allows electrical connection to be easily and reliably made between the conductive patterns 2 laminated to both surfaces of the base film 1, thereby facilitating an increase in density.

<Cover Layer>

The cover layer 4 includes a first resin layer covering the laminated structure 3 and a second resin layer 7 laminated to the inner side of the first resin layer 6.

(First Resin Layer)

The main polymer of the first resin layer 6 may be a polyimide, polyethylene terephthalate, a fluorine resin, or the like. In particular, a polyimide having a high softening temperature is preferable.

The lower limit of the average thickness of the first resin layer 6 is preferably 1 µm and more preferably 3 µm. Further, the upper limit of the average thickness of the first resin layer 6 is preferably 8 µm and more preferably 6 µm. Use of the average thickness of the first resin layer 6 that is less than the lower limit may create a risk that the strength of the first resin layer 6 is insufficient so as to fail to provide a sufficient coating for the second resin layer 7. Conversely, use of the average thickness of the first resin layer 6 that exceeds the upper limit results in the flexible printed circuit board being needlessly thick, which may create a risk of disregarding the demand for reduction in the thickness of a flexible printed circuit board.

The lower limit of the softening temperature of the first resin layer 6 is preferably 150° C., more preferably 200° C., and still more preferably 300° C. Use of the softening temperature of the first resin layer 6 that is less than the lower limit may create a risk that the first resin layer 6 softens together with the second resin layer 7 in the pressure bonding step S3, which will be described later, at the time of making the flexible printed circuit board, which results in a failure to provide a sufficient coating for the second resin layer 7. Although the upper limit of the softening temperature of the first resin layer is not limited to a particular value, the upper limit may be 600° C., for example.

(Second Resin Layer)

The second resin layer 7, which is laminated to the inner side of the first resin layer 6, is injected onto the conductive pattern 2 of the laminated structure 3.

The main polymer of the second resin layer 7 may be an epoxy resin, an acrylic resin, a butyral resin, or the like. In particular, an epoxy resin having a relatively low softening temperature is preferable.

The second resin layer 7 covers the conductive pattern 2. The lower limit of the average thickness (i.e., thickness D in FIG. 3) of the second resin layer 7 between the top surface of the conductive pattern 2 and the first resin layer 6 is preferably 0.2 μm and more preferably 0.5 μm. Further, the upper limit of the average thickness D of the second resin layer 7 is preferably 1.5 μm and more preferably 1 μm. Use of the average thickness D of the second resin layer 7 that is less than the lower limit may create a risk that the adhesion of the first resin layer 6 is insufficient so as to fail to provide a sufficient protection by the cover layer 4 for the conductive pattern 2. Conversely, use of the average thickness D of the second resin layer 7 that exceeds the upper limit results in the flexible printed circuit board being needlessly thick, which may create a risk of disregarding the demand for reduction in the thickness of a flexible printed circuit board.

Figure 3:
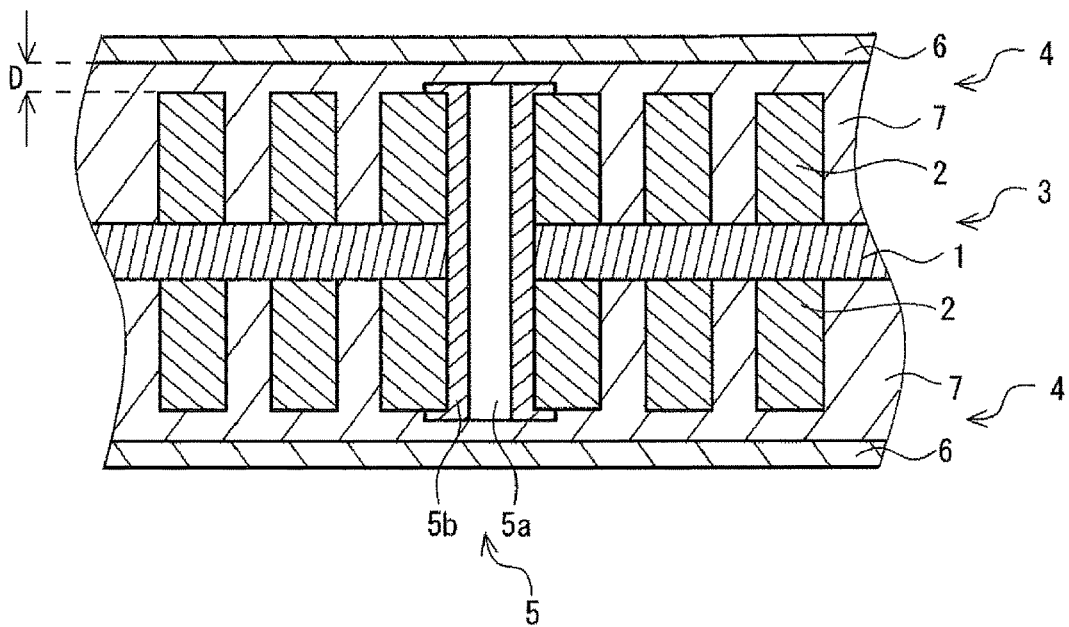
FIG. 3 is a cross-sectional view taken along the line A-A in the flexible printed circuit board of FIG. 2.
Figure 4:
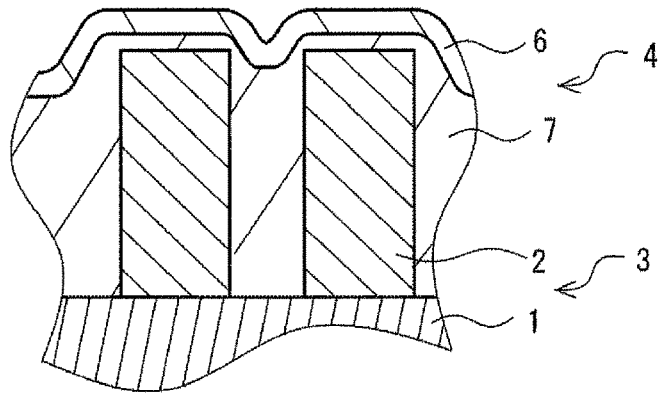
FIG. 4 is an enlarged, partial, schematic cross-sectional view of a flexible printed circuit board different from FIG. 3.

In the portion where the conductive pattern 2 is not laminated, the second resin layer 7 fills the gaps between the lines of the conductive pattern 2 to cover the base film 1. As illustrated in FIG. 4, the average thickness of such a filling portion of the second resin layer 7 may be less than the average thickness of the conductive pattern 2. However, the filling portion preferably has a thickness providing the same height as the portion covering the conductive pattern as illustrated in FIG. 3. Making the average thickness of the filling portion of the second resin layer 7 the same thickness as the portion covering the conductive pattern 2 allows the first resin layer to be implemented as a flat plate shape. This arrangement enhances the effect of the cover layer 4 to provide protection for the conductive pattern 2, and, at the same time, prevents tension and stress from being applied by the cover layer 4 to electronic components or the like formed by the conductive pattern 2 on the base film 1.

In the case in which the average thickness of the filling portion of the second resin layer 7 is less than the average thickness of the conductive pattern 2 as illustrated in FIG. 4, the ratio of the average thickness of the filling portion of the second resin layer 7 to the average thickness of the conductive pattern 2 has a lower limit that is preferably 50%, more preferably 75%, and still more preferably 90%. When the ratio of the average thickness of the filling portion of the second resin layer 7 is less than the lower limit, there may be a risk of insufficient protection for the conductive pattern 2 due to the surface irregularities of the cover layer 4.

The lower limit of the softening temperature of the second resin layer 7 is preferably 50° C. and more preferably 70° C. The upper limit of the softening temperature of the second resin layer 7 is preferably 150° C. and more preferably 120° C. Use of the softening temperature of the second resin layer 7 that is lower than the lower limit may create a risk of deformation of the cover layer 4 due to heat generated by electronic components during operations. Conversely, use of the softening temperature of the second resin layer 7 that exceeds the upper limit may create a risk that the second resin layer 7 does not sufficiently softens in the pressure bonding step S3, which will be described later, at the time of making a flexible printed circuit board, thereby causing the second resin layer 7 to fail to fill the gaps sufficiently between the lines of the conductive pattern 2.

The second resin layer 7 softens at a lower temperature than does the first resin layer 6. The lower limit of a difference in softening temperature between the first resin layer 6 and the second resin layer 7 is preferably 50° C., more preferably 100° C., and still more preferably 300° C. Use of the difference in softening temperature that is less than the lower limit may create a risk that the first resin layer 6 softens together with the second resin layer in the pressure bonding step S3, which will be described later, at the time of making a flexible printed circuit board, which results in a failure to provide a sufficient coating for the second resin layer 7. The upper limit of the softening temperature is not limited to a particular value, and may be 400° C., for example.

Reducing the thickness of the cover layer 4 allows the thickness of the flexible printed circuit board to be reduced. The upper limit of the average thickness of the flexible printed circuit board is preferably 160 μm and more preferably 150 μm. Use of the average thickness of the flexible printed circuit board that exceeds the upper limit may create a risk of disregarding the demand for reduction in the thickness of the flexible printed circuit board. The lower limit of the average thickness of the flexible printed circuit board is not limited to a particular value, and may be 50 μm, for example, as determined in view of a resistance value or the like required for the conductive pattern 2.

[Method of Making Flexible Printed Circuit Board]

In the following, the steps of the method of making the flexible printed circuit board will be described in detail.

<Laminated-Structure Forming Step>

In the laminated-structure forming step S1, the conductive patterns 2 are laminated to the base film 1 The through-hole 5 is further formed according to need. The specific procedure is as follows.

A conductive layer is formed on both surfaces of the base film 1.

The conductor layer may be formed by bonding a conductor foil through an adhesive or by a deposition method known in the art, for example. Examples of the conductor include copper, silver, gold, nickel, and the like. The adhesive is not limited to any particular adhesive as long as the adhesive is capable bonding the conductor to the base film 1, and various adhesives known in the art may be used. Examples of the deposition method include vapor deposition, plating, and the like. The conductor layer is preferably formed by bonding a copper foil to the base film 1 through a polyimide adhesive.

The conductive layers are then patterned to form the conductive patterns 2.

Patterning of the conductor layer may be performed by a method known in the art, such as photoetching. Photoetching is performed by forming a resist film with a predetermined pattern on one surface of the conductive layer, by subsequently treating the conductive layer exposed from the resist film with an etchant, and by removing the resist film.

In the case of forming the through-hole 5, the penetrating hole 5a extending through the base film and the conductive patterns 2 laminated to both surfaces of the base film 1 is formed after the conductive patterns 2 are formed. Then, the plating 5b is applied to the circumferential wall of the penetrating hole 5a.

The through-hole may be formed by forming the penetrating hole 5a as described above, followed by injecting, and then causing to be hardened by heat, silver paste, copper paste, or the like in the penetrating hole 5a.

<Superimposing Step>

Figure 5:
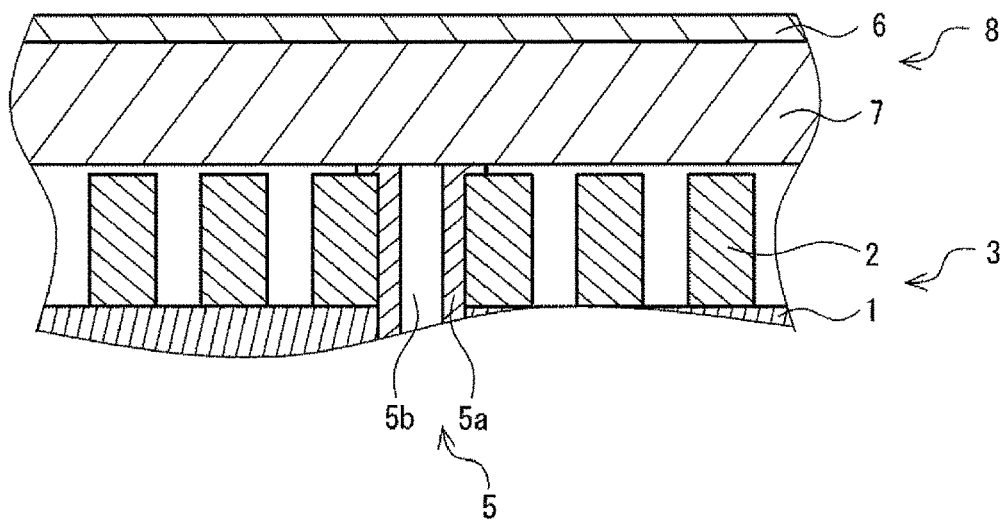
FIG. 5 is a schematic cross-sectional view illustrating a superimposing step in the method of making a flexible printed circuit board.

In the superimposing step S2, the cover film 8 including the first resin layer 6 and the second resin layer 7 laminated to the inner side of the first resin layer 6 is superimposed on the conductive pattern 2 of the laminated structure 3 formed in the laminated-structure forming step S1, as illustrated in FIG. 5.

Specifically, the exterior surface of the second resin layer 7 of the cover film 8 is placed in contact with the surfaces of the conductive pattern 2 and the through-hole 5 of the laminated structure 3. Since the conductive pattern 2 is formed on both surfaces of the base film 1, two cover films 8 are used such that the cover films 8 are superimposed on the respective surfaces.

The first resin layers 6 of the cover films 8 become the first resin layers 6 of the flexible printed circuit board that has previously been described. The first resin layers 6 of the cover films 8 are the same as or similar to the first resin layers of the flexible printed circuit board that has previously been described, and a description thereof will be omitted.

The second resin layers 7 of the cover films 8 are softened in the pressure bonding step S3, which will be described later, to cover the conductive patterns 2 as well as to fill the gaps between the lines of the conductive patterns 2, thereby becoming the second resin layers 7 of the flexible printed circuit board that has previously been described.

The average thickness of the second resin layer 7 of each cover film 8 is determined by an amount of resin required both to cover the conductive pattern and to fill the gaps between the lines of the conductive pattern 2. The lower limit of the average thickness of the second resin layer 7 of the cover film 8 is preferably 20 μm and more preferably 30 μm. The upper limit of the average thickness of the second resin layer 7 of the cover film 8 is preferably 50 μm and more preferably 40 μm. When the average thickness of the second resin layer 7 of the cover film 8 is less than the lower limit, there may be a risk that the cover layer 4 formed after the pressure bonding step S3 have large surface irregularities, resulting in an insufficient protection for the conductive pattern 2. Conversely, use of the average thickness of the second resin layer 7 of the cover film 8 that exceeds the upper limit results in the produced flexible printed circuit board being needlessly thick, which may create a risk of disregarding the demand for reduction in the thickness of a flexible printed circuit board.

The second resin layers 7 of the cover films 8 are the same as or similar to the second resin layers of the flexible printed circuit board that has previously been described, except for their average thicknesses. A further description thereof will thus be omitted.

<Pressure Bonding Step>

In the pressure bonding step S3, the laminated structure 3 and the cover film 8 are vacuum bagged at a temperature higher than the softening temperature of the second resin layer 7.

The lower limit of the temperature for vacuum bagging is preferably 60° C. and more preferably 70° C. The upper limit of the temperature for vacuum bagging is preferably 100° C. and more preferably 90° C. Use of a vacuum bagging temperature that is less than the lower limit may create a risk that the second resin layer 7 does not sufficiently softens, thereby causing the second resin layer 7 to fail to fill the gaps sufficiently between the lines of the conductive pattern 2. Use of a vacuum bagging temperature that exceeds the upper limit may create a risk of deterioration in the characteristics of electronic components and the like mounted on the base film 1.

The lower limit of the vacuum bagging pressure is preferably 0.1 MPa and more preferably 0.2 MPa. The upper limit of the vacuum bagging pressure is preferably 0.5 MPa and more preferably 0.4 MPa. Use of vacuum bagging pressure that is less than the lower limit may create a risk of excessive manufacturing costs. Conversely, use of vacuum bagging pressure that exceeds the upper limit may create a risk that the second resin layer 7 fails to fill the gaps sufficiently between the lines of the conductive pattern 2.

The lower limit of the duration of vacuum bagging is preferably 10 seconds and more preferably 15 seconds. The upper limit of the duration of vacuum bagging is preferably 30 seconds and more preferably 25 seconds. Use of the duration of vacuum bagging that is less than the lower limit may create a risk that the second resin layer 7 fails to fill the gaps sufficiently between the lines of the conductive pattern 2. Conversely, use of the duration of vacuum bagging that exceeds the upper limit may create a risk of reduced manufacturing efficiency.

It may be noted that the cover film 8 may preferably be made of a photo-curable resin and exposed to ultraviolet light after vacuum bagging. Curing through exposure to ultraviolet light as described above may prevent the cover layer 4 from deforming due to generated heat during the operation of electronic components.

Advantage

The method of making a flexible printed circuit board uses the two-layer cover film 8 that has the first resin layer 6 and the second resin layer 7 that is laminated to the inner side of the first resin layer 6. In the method of making a flexible printed circuit board, the cover film 8 is vacuum bagged in the pressure bonding step S2 at a temperature higher than the softening temperature of the second resin layer 7 wherein the softening temperature of the second resin layer 7 is lower than that of the first resin layer 6. As a result, the second resin layer 7 is selectively softened to cover the conductive pattern 2 laminated to the base film 1. The first resin layer 6 laminated to the outer side of the second resin layer 7 seals the second resin layer 7, which provides the cover layer 4. Accordingly, use of this method of making a flexible printed circuit board ensures that the conductive pattern 2 is more reliably coated even when the thickness of the cover layer 4 is reduced, compared with the case in which the first resin layer 6 and the second resin layer 7 are separately laminated. This serves to reduce the size of an entire flexible printed circuit board.

Further, such a flexible printed circuit board uses an epoxy resin as the main polymer of the second resin layer 7 so as to allow the conductive pattern 2 to be reliably coated with the second resin layer due to its fluidity obtained at the time of softening. Moreover, the flexible printed circuit board uses a polyimide as the main polymer of the first resin layer 6 so as to allow the second resin layer 7 to be selectively softened, which results in the second resin layer 7 being securely sealed with the first resin layer 6. As a result, the flexible printed circuit board allows the conductive pattern 2 to be more reliably coated even when the thickness of the cover layer 4 is reduced, which serves to reduce the size of an entire flexible printed circuit board.

Other Embodiments

The embodiments disclosed herein should be regarded as examples only and as non-limiting in all aspects. The scope of the present disclosures is defined by the claims without being limited to the configurations of the disclosed embodiments, and is intended to include all modifications within the spirit and equivalents of the scope of the claims.

Although the embodiments have been described with respect to a case in which the conductive pattern is laminated on both surfaces of the base film, the conductive pattern may be laminated only on one surface of the base film. In this case, only one sheet of the cover film may be used, and the cover film may be superimposed only on the conductive-pattern side of the laminated structure, followed by vacuum bagging.

Although the embodiments have been described with respect to a case in which the conductive pattern is made of metal, the conductive pattern may alternatively be implemented in other configurations. Such other configurations of the conductive pattern may include a configuration which has a core body formed by a subtractive or semi-additive process, with a thickening layer laminated by plating to the exterior surface of the core body. Use of such a configuration allows the circuit intervals to be shortened to increase the density of a conductive pattern, which further reduces the size of a flexible printed circuit board.

DESCRIPTION OF REFERENCE SYMBOLS 1 base film
2 conductive pattern
3 laminated body
4 cover layer
5 through-hole
5a penetrating hole
5b plating
6 first resin layer
7 second resin layer
8 cover film

What is claimed is:

1. A method of making a flexible printed circuit board which includes a base film having an insulating property, a conductive pattern disposed on either one or both surfaces of the base film, and a cover layer covering a conductive-pattern side of a laminated structure inclusive of the base film and the conductive pattern, the method comprising:

a superimposing step of superimposing a cover film on the conductive-pattern side of the laminated structure, the cover film having a first resin layer and a second resin layer that is laminated to an inner side of the first resin layer and that softens at a lower temperature than does the first resin layer, and a pressure bonding step of vacuum bagging the laminated structure and the cover film at a temperature higher than a softening temperature of the second resin layer, wherein the second resin layer sandwiched between the first resin layer and the base film at positions where no conductor of the conductive pattern is provided has a height less than or equal to a height of the second resin layer covering a conductor of the conductive pattern, and has an average thickness greater than or equal to 50%, and less than 100%, of an average thickness of the conductive pattern.

2. The method of making a flexible printed circuit board as claimed in claim 1, wherein a main polymer of the first resin layer is a polyimide, and a main polymer of the second resin layer is an epoxy resin.

3. The method of making a flexible printed circuit board as claimed in claim 1, wherein an average circuit pitch of the conductive pattern is greater than or equal to 5 μm and less than or equal to 20 μm.

4. The method of making a flexible printed circuit board as claimed in claim 1, wherein the conductive pattern forms a planar coil element.

5. The method of making a flexible printed circuit board as claimed in claim 2, wherein an average circuit pitch of the conductive pattern is greater than or equal to 5 μm and less than or equal to 20 μm.

6. The method of making a flexible printed circuit board as claimed in claim 2, wherein the conductive pattern forms a planar coil element.

7. The method of making a flexible printed circuit board as claimed in claim 3, wherein the conductive pattern forms a planar coil element.

8. The method of making a flexible printed circuit board as claimed in claim 5, wherein the conductive pattern forms a planar coil element.

* * * * *